United States Patent — Matsuyama

(10) Patent No.: US 12,463,608 B2
(45) Date of Patent: Nov. 4, 2025

(54) SOUND OUTPUT DEVICE

(71) Applicant: ALPS ALPINE CO., LTD., Tokyo (JP)

(72) Inventor: Minoru Matsuyama, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 446 days.

(21) Appl. No.: 18/131,158

(22) Filed: Apr. 5, 2023

(65) Prior Publication Data

US 2023/0327617 A1  Oct. 12, 2023

(30) Foreign Application Priority Data

Apr. 12, 2022  (JP) .................... 2022-065494

(51) Int. Cl.
   H03F 3/217 (2006.01)

(52) U.S. Cl.
   CPC ......... H03F 3/2175 (2013.01); H03F 3/2171 (2013.01); *H03F 2200/03* (2013.01); *H03F 2200/351* (2013.01)

(58) Field of Classification Search
   CPC .. H03F 3/2175; H03F 3/2171; H03F 2200/03; H03F 2200/351; H04R 2420/05; H04R 3/00; H04R 2430/03
   USPC ...................................... 330/251, 10, 207 A
   See application file for complete search history.

(56) References Cited

U.S. PATENT DOCUMENTS

| | | | |
|---|---|---|---|
| 8,571,225 B2 | 10/2013 | Botti et al. | |
| 10,877,087 B1 | 12/2020 | Joharapurkar et al. | |
| 2005/0093622 A1* | 5/2005 | Lee | H03F 3/2171 |
| | | | 330/10 |
| 2020/0236482 A1 | 7/2020 | Akahori | |

FOREIGN PATENT DOCUMENTS

| | | |
|---|---|---|
| CN | 111479206 | 11/2022 |
| JP | 08-317498 | 11/1996 |
| JP | 2020-120343 | 8/2020 |

OTHER PUBLICATIONS

European Search Report, dated Sep. 9, 2023, pp. 1-7, issued in Application Number 23164881.7, European Patent Office, Munich Germany.

* cited by examiner

*Primary Examiner* — Andrea Lindgren Baltzell
*Assistant Examiner* — Khiem D Nguyen
(74) *Attorney, Agent, or Firm* — Crowell & Moring LLP

(57) ABSTRACT

A sound output device of the present disclosure includes a controller, a power amplifier, a low-pass filter, and a speaker. The controller includes first and second low-pass filters configured to remove high-frequency components of a sound input signal and a sound output signal, a first peak detection unit configured to detect a peak current of the sound input signal from which the high-frequency component has been removed, a second peak detection unit configured to detect a peak current of the sound output signal from which the high-frequency component has been removed, and a comparison unit configured to compare the peak current with the peak current and determine connection or disconnection of the speaker when a level of the peak current is equal to or higher than a certain level.

7 Claims, 4 Drawing Sheets

FIG. 3

|  | RELATED ART | PRESENT EMBODIMENT |
|---|---|---|
| SPEAKER CONNECTION | 1.26 | 1.48 |
| SPEAKER OPEN | 0.43 | 0.35 |
| CONNECTION/OPEN | 2.93 | 4.23 |

SOUND OUTPUT DEVICE

RELATED APPLICATION

The present application claims priority to Japanese Patent Application Number 2022-065494, filed Apr. 12, 2022, the entirety of which is hereby incorporated by reference.

BACKGROUND

1. Field of the Disclosure

The present disclosure relates to a sound output device that outputs a sound from a speaker, and particularly relates to detection of connection/disconnection of the speaker.

2. Description of the Related Art

As a technique for detecting the presence or absence of a speaker connection of a sound output device, for example, in JP 3355065 B2, a speaker line is connected to a secondary winding of an output transformer, and connection/disconnection of the speaker line is detected by comparing a first voltage signal amplified by a voltage amplifier that negatively feeds back a voltage corresponding to a voltage induced in the secondary winding with a second voltage signal corresponding to a voltage induced on the secondary winding side of the output transformer. A sound output device in JP 2019-48528 A includes a processing unit that performs processing on an input signal, a speaker that outputs a sound on the basis of an output signal from the processing unit, and a determination unit that determines a failure of the processing unit from a difference between a level of the input signal and a level of the output signal.

SUMMARY

In a conventional audio amplifier, a connection of a speaker is examined only at the time of starting, but a product related to safety such as a proximity warning sound device mounted on an electric vehicle, or the like, is required to constantly check a connection of a speaker. In order to satisfy this requirement, an amplifier having an output current measurement function is used, and an input current level and an output current level of the amplifier are compared. In a case where the output current level is sufficiently high, it is determined that the speaker is connected, and in a case where the output current level is sufficiently low, it is determined that the speaker is not connected.

FIG. 1 is a block diagram illustrating a configuration of a conventional sound output device (audio amplifier). A sound output device 10 includes a controller 20, a power amplifier 60, a low-pass filter 70, and a speaker 80. The controller 20 has a function of detecting connection or disconnection of the speaker 80. The controller 20 includes a signal processing unit 30 and a comparison unit 40. The signal processing unit 30 receives an analog sound input signal S1 indicating an original sound, performs processing such as noise removal or amplification on the sound input signal S1, and provides the processed sound input signal S2 to the comparison unit 40 and the power amplifier 60.

The power amplifier 60 is a class D amplifier, and includes a PWM generator that generates a pulse width modulation (PWM) signal for changing a duty ratio of a pulse according to an input signal level of the analog sound input signal S2 that has been input, and a switching circuit that converts the PWM signal into a PWM output signal S3 amplified to a voltage level of +V/−V.

The low-pass filter 70 removes a high-frequency component from the PWM output signal S3 output from the power amplifier 60 to generate an analog sound signal S4 in an audible band, and the speaker 80 outputs a sound in response to the analog sound signal S4.

The power amplifier 60 further has a function of measuring an output current value of the PWM output signal S3, and provides the output current value (output current level) Iout to the comparison unit 40 of the controller 20. The comparison unit 40 compares an input current level Iin of the sound input signal S2 input to the power amplifier 60 with the output current level Iout of the power amplifier 60, determines that the speaker 80 is connected when the output current level Iout is sufficiently higher than the input current level Iin, and determines that the speaker 80 is not connected when the output current level Iout is sufficiently lower than the input current level Iin. The controller 20 further outputs an alarm or the like to a display in a case where it is determined that the speaker 80 is not connected.

However, such a conventional method for determining the presence or absence of speaker connection has the following problems. In the class D power amplifier 60 as illustrated in FIG. 1, since the low-pass filter 70 is connected to the output thereof, in a case where a frequency of the PWM signal handled by the power amplifier 60 becomes high, the output current value Iout increases, and thus it is difficult to distinguish whether or not the output current value Iout is large because the speaker 80 is connected. That is, even in a case where the speaker 80 is not connected, the output current level Iout exceeds a threshold value for connection determination, and thus it is erroneously determined that the speaker 80 is connected.

Since there is a delay associated with the digital-to-analog conversion in the power amplifier 60 between the input current level Iin of the sound input signal S2 input to the power amplifier 60 and the output current level Iout output from the power amplifier 60, the input current level Iin and the output current level Iout cannot be simply compared with each other. If the input current level Iin and the output current level Iout are simply compared, it may be erroneously determined that the speaker is connected.

In the class D power amplifier 60, even in a case where the input level of the sound input signal S2 is extremely low, a current flows through the switching circuit (even if the input level is 0, the current flows because the duty ratio of the PWM signal is 50%), and thus it may be erroneously determined that the speaker 80 is connected even though the speaker 80 is not connected.

The present disclosure addresses such a conventional problem, and an object thereof is to provide a sound output device having a function of more accurately determining the presence or absence of speaker connection during an operation.

According to the present disclosure, there is provided a sound output device having a function of detecting connection or disconnection of a speaker. In one form, a sound output device includes a class D amplifier configured to receive a sound input signal and to generate a sound output signal obtained by amplifying the sound input signal; a speaker configured to output a sound in response to the sound output signal; and a detection unit configured to detect connection or disconnection of the speaker, in which the detection unit includes a first filter configured to remove a high-frequency component of the sound input signal, a second filter configured to remove a high-frequency component of the sound output signal, and a comparison unit configured to compare the sound input signal from which the high-frequency component has been removed by the first filter with the sound output signal from which the high-frequency component has been removed by the second filter, and determine connection or disconnection of the speaker on the basis of a comparison result.

In some implementations, the sound output device further includes a first detection unit configured to detect a first peak current, in a certain period, of the sound input signal from which the high-frequency component has been removed by the first filter; and a second detection unit configured to detect a second peak current, in a certain period, of the sound output signal from which the high-frequency component has been removed by the second filter, in which the comparison unit compares the first peak current with the second peak current, and determines connection or disconnection of the speaker on the basis of a comparison result.

In some implementations, the detection unit further includes a level check unit configured to check a level of the first peak current, and the comparison unit determines connection or disconnection of the speaker on the basis of the level checked by the level check unit.

In some implementations, the comparison unit does not determine connection or disconnection of the speaker in a case where the level of the first peak current is less than a certain level, and the comparison unit determines connection or disconnection of the speaker in a case where the level of the first peak current is equal to or higher than the certain level.

In some implementations, the comparison unit determines that the speaker is connected when a ratio or a difference between the first peak current and the second peak current is more than a first threshold value.

In some implementations, the comparison unit determines that the speaker is not connected when a ratio or a difference between the first peak current and the second peak current is less than a second threshold value.

In some implementations, the sound output device further includes a low-pass filter between the amplifier and the speaker, in which the low-pass filter converts a PWM signal output from the amplifier into an analog sound signal in an audible band.

According to forms of the present disclosure, the high-frequency components of the sound input signal and the sound output signal are removed, and the sound input signal and the sound output signal from which the high-frequency components have been removed are compared. Therefore, it is possible to prevent erroneous determination of speaker connection due to an increase in the frequency of the sound output signal of the amplifier. By comparing the peak current of the sound input signal with the peak current of the sound output signal, it is possible to cancel the mismatch due to the delay between the sound input signal and the sound output signal and to prevent erroneous determination of speaker connection. In a case where the input level of the sound input signal is extremely low, erroneous determination of speaker connection can be prevented by stopping the comparison between the sound input signal and the sound output signal.

BRIEF DESCRIPTION OF THE DRAWINGS

FIG. 3 is a table illustrating an example of a determination of speaker connection/disconnection according to one embodiment of the present disclosure.

DETAILED DESCRIPTION

Forms of a sound output device according to the present disclosure has a function of detecting the presence or absence of connection of a speaker not only at the time of starting but also at all times (during a period in which a sound is output). The sound output device according to the present disclosure is not particularly limited, but is used for, for example, a proximity warning sound device or an audio device that generates a warning sound from a speaker for a nearby pedestrian or the like in an electric vehicle or the like.

EMBODIMENTS

Figure 1:
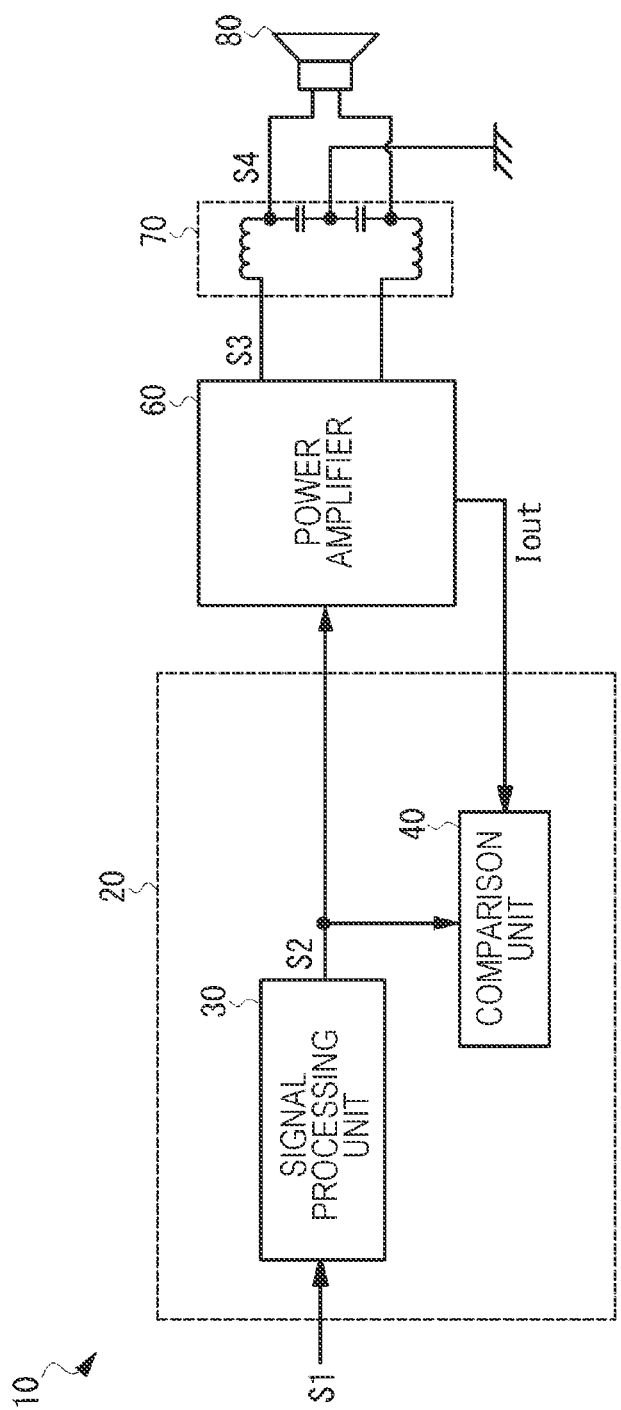
FIG. 1 is a block diagram illustrating a configuration of a conventional sound output device.
Figure 2:
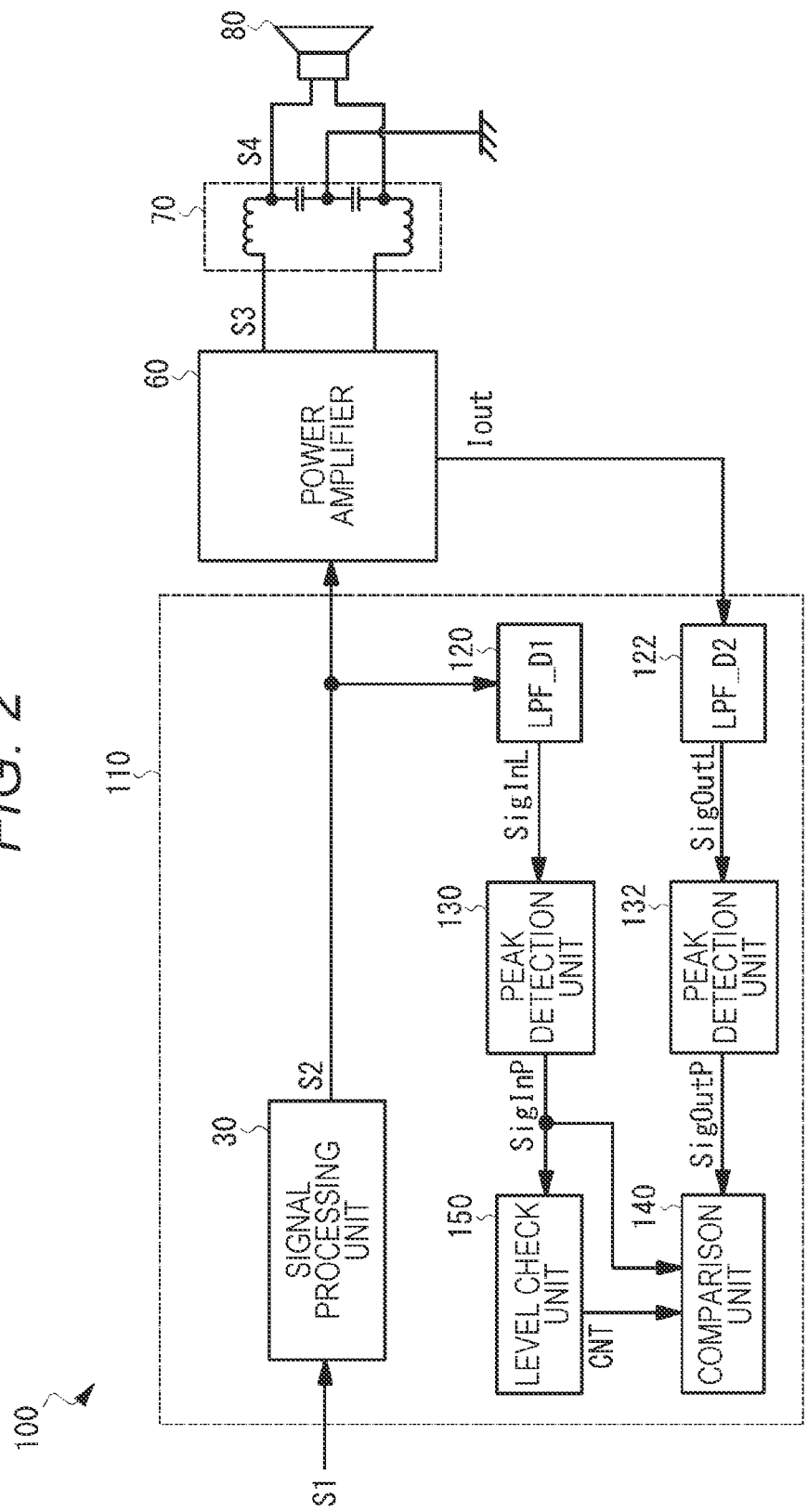
FIG. 2 is a block diagram illustrating a configuration of a sound output device according to an embodiment of the present disclosure.

FIG. 2 is a block diagram illustrating a configuration of a sound output device according to an embodiment of the present disclosure. The same constituents as those in FIG. 1 are denoted by the same reference numerals. A sound output device 100 of the present embodiment includes a controller 110, a power amplifier 60, a low-pass filter 70, and a speaker 80.

The controller 110 has a function of detecting connection or disconnection of the speaker in the sound output device 100. In addition to the signal processing unit 30 illustrated in FIG. 1, the controller 110 includes a first low-pass filter 120 that removes a high-frequency component of the analog sound input signal S2 output from the signal processing unit 30, a first peak detection unit 130 that receives a sound input signal SigInL from the first low-pass filter 120 and detects a peak value (maximum value) of an input current level of the sound input signal SigInL in a certain period, a second low-pass filter 122 that removes a high-frequency component of the output current level Iout output from the power amplifier 60, a second peak detection unit 132 that receives a sound output signal SigOutL from the second low-pass filter 122 and detects a peak value (maximum value) of an output current of the sound output signal SigOutL in a certain period, a comparison unit 140 that receives a detection signal SigInP detected by the first peak detection unit 130 and a detection signal SigOutP detected by the second peak detection unit 132 and determines connection or disconnection of the speaker 80 from a ratio or a difference between the detection signal SigInP and the detection signal SigOutP, and a level check unit 150 that provides a control signal CNT to the comparison unit 140 on the basis of the detection signal SigInP from the first peak detection unit 130.

The signal processing unit 30 receives the analog sound input signal S1 representing the original sound, performs a filtering process, an amplification process, and the like thereon, and provides the processed analog sound input signal S2 to the first low-pass filter 120 and the power amplifier 60.

The power amplifier 60 is configured with a class D amplifier, and includes a PWM generator that generates a pulse width modulation (PWM) signal for changing a duty ratio of a pulse according to an input signal level of the analog sound input signal S2, and a switching circuit that converts a PWM output signal into the PWM output signal S3 amplified to a voltage level of +V/−V. The switching circuit includes, for example, transistors that are connected in series between a +V voltage source and a −V voltage source and perform a push-pull operation, turns on one transistor in response to the PWM signal and off the other transistor to generate the PWM output signal S3 with a level of +V, and turns off the one transistor and on the other transistor to generate the PWM output signal S3 with a level of −V.

The low-pass filter 70 is designed with a cutoff frequency according to the impedance of the speaker 80 and the characteristics of the power amplifier 60, removes a high-frequency component from the PWM output signal S3 from the power amplifier 60 to generate an analog sound signal S4 in an audible band, and the speaker 80 outputs a sound in response to the analog sound signal S4.

The power amplifier 60 further measures an output current value on the basis of the PWM output signal S3, and provides an analog signal representing the measured output current value Tout to the second low-pass filter 122.

The first low-pass filter 120 receives the analog sound input signal S2, removes a high-frequency component equal to or higher than a preset cutoff frequency f1 from the analog sound input signal S2, and provides a signal SigInL as a result of the removal to the first peak detection unit 130.

The second low-pass filter 122 has the same configuration as that of the first low-pass filter 120, removes a high-frequency signal equal to or higher than a preset cutoff frequency f2 (f1=f2) from an analog signal representing the output current value Tout, and provides a signal SigOutL as a result of the removal to the second peak detection unit 132.

By removing the high-frequency component in advance from the input current level of the sound input signal S2 and the output current level of the PWM output signal S3 with the first and second low-pass filters 120 and 122, the comparison unit 140 does not compare the input current level and the output current level of the high-frequency components of the sound input signal S2 and the sound output signal S5. When the frequency of the PWM signal handled by the power amplifier 60 increases, the current consumption in the low-pass filter 70 increases, the output current level increases even if the speaker is not connected, and there is a possibility that erroneous determination may occur in speaker connection or disconnection. Therefore, such a situation is avoided.

The first peak detection unit 130 receives the signal SinInL from the first low-pass filter 120, detects the highest peak value (maximum value) of the signal SinInL in a preset period T1 (for example, a period of 5 ms), and provides a detection signal SinInP indicating the peak value to the comparison unit 140 and the level check unit 150. The second peak detection unit 132 has the same configuration as that of the first peak detection unit 130, receives the signal SigOutL from the second low-pass filter 122, detects the highest peak (maximum value) of the signal SigOutL in a preset period T2 (T1=T2), and provides a detection signal SigOutP indicating the peak value to the comparison unit 140. By detecting peak values in a certain period with the first and second peak detection units 130 and 132, a delay associated with the measurement of the output current value Tout from the power amplifier 60 is compensated in the comparison between the input current level and the output current level in the comparison unit 140. That is, the influence of the delay between the sound input signal S2 and the PWM output signal S3 can be ignored.

The level check unit 150 provides the control signal CNT for enabling/disabling the comparison unit 140 to the comparison unit 140 on the basis of the detection signal SinInP from the first peak detection unit 130. For example, in a case where the peak value of the input current level of the sound input signal is extremely low (that is, in a case where the peak value is smaller than a threshold value), the level check unit 150 outputs the control signal CNT (for example, an L level signal) for preventing comparison using the comparison unit 140 from being performed, and in a case where the peak value of the input current level is equal to or greater than the threshold value, the level check unit outputs the control signal CNT (for example, an H level signal) for enabling comparison using the comparison unit 140. As a result, in a case where the input signal level of the sound input signal S2 is low, the comparison unit 140 does not perform comparison, and thus prevents erroneous determination of speaker connection/disconnection.

In response to the control signal CNT from the level check unit 150, the comparison unit 140 compares the peak value indicated by the detection signal SinInP with the peak value indicated by the detection signal SigOutP when the input level of the sound input signal S2 is equal to or higher than a certain level. The comparison unit 140 determines that the speaker 80 is connected when a ratio or a difference between the two values is equal to or more than a threshold value, and determines that the speaker 80 is not connected (open) when the ratio or the difference between the two values is less than the threshold value. For example, the comparison unit 140 determines that the speaker 80 is connected when (SigOutP/SigInP)>1.0, and determines that the speaker 80 is not connected when (SigOutP/SigInP)<0.5.

FIG. 3 is a table illustrating a determination example of speaker connection or disconnection. A ratio between peak values of input/output currents at speaker connection/open is 2.93 in the related art, whereas in the present embodiment, the ratio is 4.23, which makes it possible to increase a difference (margin) from a threshold value for speaker connection or disconnection. As a result, it is possible to stably check connection or disconnection of the speaker (in the present embodiment, the difference from the threshold value is improved by 3 dB compared with the conventional case).

As described above, according to the present embodiment, by removing the high-frequency components of the sound input signal and the sound output signal and comparing the peak currents of the sound input signal and the sound output signal as a result of the removal in a certain period, it is possible to prevent erroneous determination of speaker connection due to an increase in the frequency of the PWM signal handled by the power amplifier, and it is also possible to cancel mismatch due to a delay between the sound input signal and the sound output signal and thus to prevent erroneous determination of speaker connection. In a case where the input level of the sound input signal is extremely low, erroneous determination of speaker connection can be prevented by stopping the comparison between the sound input signal and the sound output signal.

Next, another embodiment of the present disclosure will be described. In implementations of the sound output device 100 illustrated in FIG. 2 described above, the example in which the controller 110 detects speaker connection/disconnection using the analog circuit has been described, but processing equivalent to the analog circuit may be performed by a digital circuit.

Figure 4:
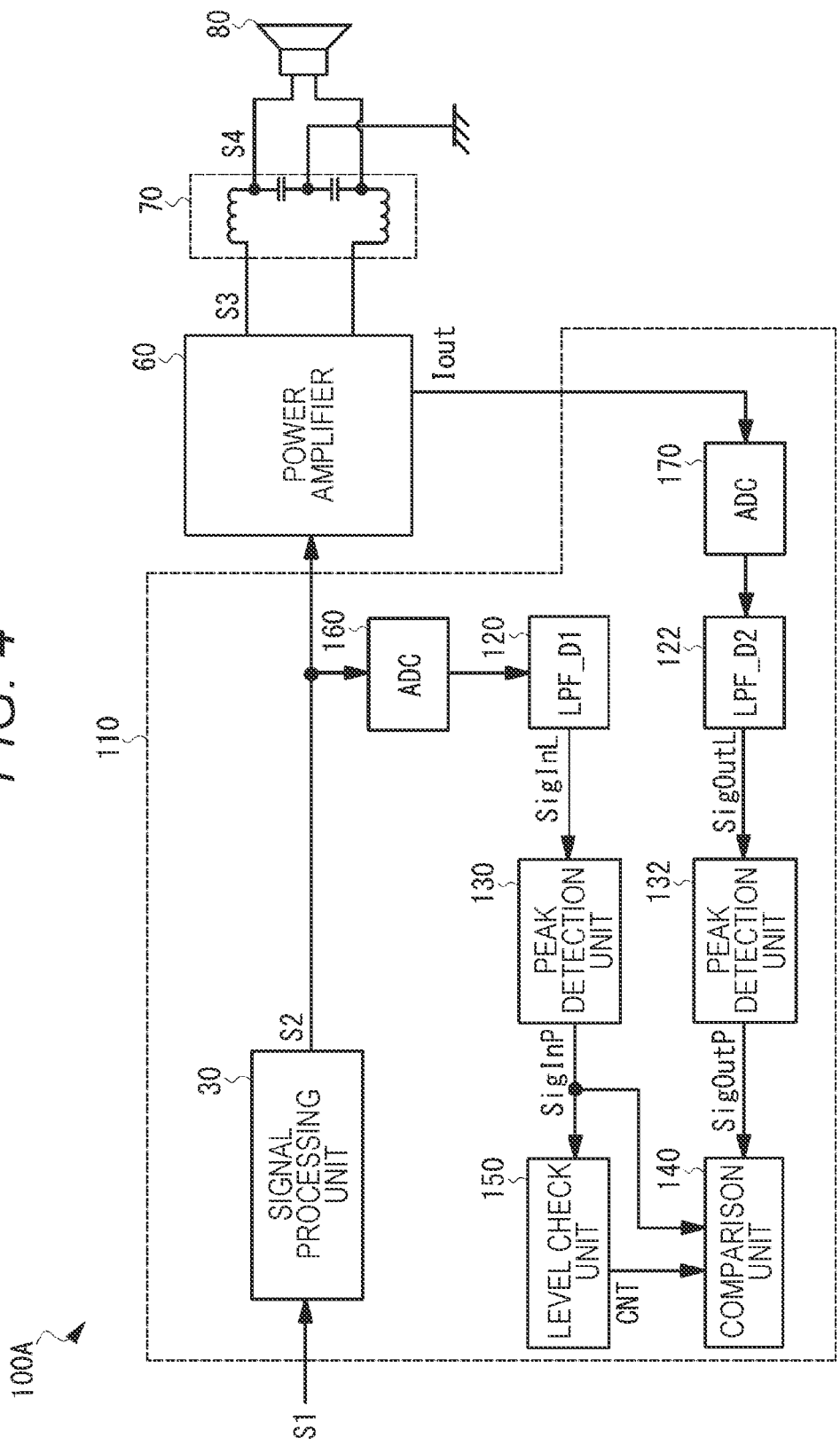
FIG. 4 is a block diagram illustrating a configuration of a sound output device according to another embodiment of the present disclosure.

FIG. 4 is a block diagram illustrating a configuration of a sound output device according to another embodiment of the present disclosure. In the sound output device 100A, the controller 110 includes an AD converter 160 that digitally converts the sound input signal S2 and an AD converter 170 that digitally converts an analog signal indicating the output current value Iout, and the first and second low-pass filters 120 and 122, the first and second peak detection units 130 and 132, the level check unit 150, and the comparison unit 140 are configured by digital circuits. As still another aspect, the controller 110 may be a circuit in which a digital circuit and an analog circuit are mixed.

Embodiments of the present disclosure have been described in detail above. However, the present disclosure is not limited to the specific embodiments, and thus various modifications and alterations can be made in the scope of the gist of the disclosure in the claims.

The invention claimed is:

1. A sound output device having a function of detecting connection or disconnection of a speaker, the sound output device comprising:
    a class D amplifier configured to receive a sound input signal and to generate a sound output signal that is obtained by amplifying the sound input signal;
    a speaker configured to output a sound in response to the sound output signal; and
    a detection unit configured to detect connection or disconnection of the speaker, wherein
    the detection unit includes:
        a first filter configured to remove a high-frequency component of the sound input signal,
        a second filter configured to remove a high-frequency component of the sound output signal, and
        a comparison unit configured to compare the sound input signal from which the high-frequency component has been removed by the first filter with the sound output signal from which the high-frequency component has been removed by the second filter, and to determine connection or disconnection of the speaker on the basis of a comparison result.

2. The sound output device according to claim 1, further comprising:
    a first detection unit configured to detect a first peak current, in a certain period, of the sound input signal from which the high-frequency component has been removed by the first filter; and
    a second detection unit configured to detect a second peak current, in a certain period, of the sound output signal from which the high-frequency component has been removed by the second filter,
    wherein the comparison unit compares the first peak current with the second peak current, and determines connection or disconnection of the speaker on the basis of a comparison result.

3. The sound output device according to claim 2, wherein:
    the detection unit further includes a level check unit configured to check a level of the first peak current, and
    the comparison unit is configured to determine connection or disconnection of the speaker on the basis of the level checked by the level check unit.

4. The sound output device according to claim 3, wherein:
    the comparison unit does not determine connection or disconnection of the speaker in a case where the level of the first peak current is less than a certain level, and
    the comparison unit determines connection or disconnection of the speaker in a case where the level of the first peak current is equal to or higher than the certain level.

5. The sound output device according to claim 2, wherein the comparison unit is configured to determine that the speaker is connected when a ratio or a difference between the first peak current and the second peak current is more than a first threshold value.

6. The sound output device according to claim 2, wherein the comparison unit is configured to determine that the speaker is not connected when a ratio or a difference between the first peak current and the second peak current is less than a second threshold value.

7. The sound output device according to claim 1, further comprising a low-pass filter between the amplifier and the speaker, wherein the low-pass filter is configured to convert a PWM signal output from the amplifier into an analog sound signal in an audible band.

* * * * *